UNIDIRECTIONAL TUNNEL DIODE PULSE CIRCUITS

Filed Jan. 3, 1961

2 Sheets-Sheet 1

INVENTOR.
MELVIN M. KAUFMAN
BY
Carl V. Olson
ATTORNEY

UNIDIRECTIONAL TUNNEL DIODE PULSE CIRCUITS

Filed Jan. 3, 1961 2 Sheets-Sheet 2

INVENTOR.
MELVIN M. KAUFMAN
BY
Carl V. Olson
ATTORNEY

3,142,768
UNIDIRECTIONAL TUNNEL DIODE PULSE CIRCUITS

Melvin M. Kaufman, Merchantville, N.J., assignor to Radio Corporation of America, a corporation of Delaware Filed Jan. 3, 1961, Ser. No. 88,242
15 Claims. (Cl. 307—88.5)

This invention relates to pulse circuits including negative resistance diodes, such as tunnel diodes, and more particularly to circuits having unidirectional signal transmission characteristics. While not limited thereto, the invention is useful in high speed electronic computer and data processing apparatus.

Tunnel diodes have a current-voltage characteristic including a low voltage positive resistance region, an intermediate voltage negative resistance region and a high voltage positive resistance region. A tunnel diode can be made to switch between its low voltage and high voltage states in a very short period of time, such as a fraction of a nanosecond (millimicrosecond). The advantage of very high speed operation possessed by tunnel diodes is coupled with the disadvantage that it is a two-terminal device having common input and output terminals. Therefore, a desired isolation between the input and output circuits of a tunnel diode is not provided by the tunnel diode itself, with the result that a portion of the output signal can flow back to the input circuit.

It is therefore a general object of this invention to provide an improved tunnel diode circuit having input and output terminals that are substantially isolated electrically from each other.

It is another object to provide an improved tunnel diode circuit having unidirectional signal handling characteristics.

In one aspect, the invention comprises two oppositely poled tunnel diodes connected in series. Means are provided to quiescently bias both of the diodes in their low voltage states. An input pulse is applied across both of the diodes in a polarity to switch one of the diodes from its low voltage state to its high voltage state. When the one diode switches, it results in the application of a higher voltage difference across the other diode and causes the other diode to also switch to its high voltage state. An output is then obtained across one of the diodes. At this time, the high voltage states of the two oppositely poled diodes cancel each other so that the voltage at the input terminal is substantially zero and substantially unaffected by the output signal at the output terminal. A desired isolation is thus provided between the input and output terminals of the circuit. The tunnel diodes may be connected to operate in either a monostable or a bistable mode in response to an input pulse. The output signal may be of the same polarity as the input signal, or may be of the opposite polarity. More than two tunnel diodes may be connected in the circuit to provide an output signal having a greater voltage than the input signal. For example, any even number of diodes, half poled in one direction and the remainder poled in the opposite direction, may be used.

These and other objects and aspects of the invention will be apparent to those skilled in the art from the following more detailed description taken in conjunction with the appended drawing, wherein.

Figure 1:
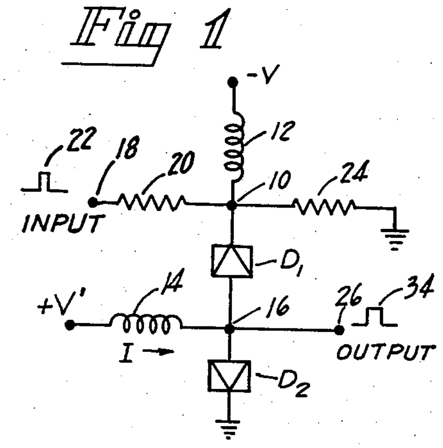
FIGURE 1 is a diagram of a monostable circuit constructed according to the teachings of the invention, and having an output terminal which is substantially isolated from the input terminal.

FIGURE 1 shows a monostable circuit including two oppositely poled tunnel diodes $D_1$ and $D_2$ connected in series between a junction point 10 and a point of reference potential such as ground. The tunnel diodes $D_1$ and $D_2$ may be germanium or gallium arsenide tunnel diodes, and they may have approximately equal peak current characteristics. The diodes are both quiescently biased in their low voltage stable operating states for monostable operation by means of a source of unidirectional potential having a $-V$ terminal connected through an inductor 12 to the terminal 10, and a source of unidirectional potential having a $+V'$ terminal connected through an inductor 14 to the junction point 16 between the two diodes. An input terminal 18 is connected through an input resistor 20 to the junction point 10 for the purpose of applying a positive input pulse 22 across the series combination of diodes $D_1$ and $D_2$. A resistor 24 is connected from the point 10 to a point of reference potential such as ground. An output terminal 26 is connected to the junction point 16 to provide an output signal from across the lower diode $D_2$.

Figure 2A:
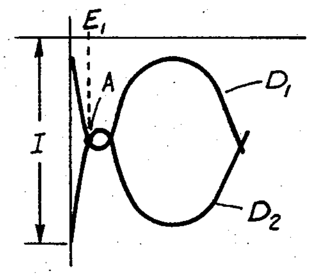
FIGURE 2 is a chart of a tunnel diode current-voltage characteristic which will be referred to in explaining the operation of the circuit of FIGURE 1.

The charts of FIGURES 2*a* through 2*d* will be referred to in describing the operation of the circuit of FIGURE 1. FIGURE 2*a* shows the initial quiescent condition of the circuit with the curve $D_2$ representing the characteristic of diode $D_2$. The curve $D_2$ is shifted downwardly from the zero current axis by an amount I representing the current I flowing from the $+V'$ terminal through the inductor 14 to the junction point 16. The curve $D_1$ in FIGURE 2*a* is the characteristic of the diode $D_1$ turned over and located to represent a load for the diode $D_2$. In the initial or quiescent bias conditions, both diodes are in their low voltage states, and are at an operating point A defined by the intersection of the curves $D_1$ and $D_2$. The operating point A illustrates the fact that equal currents, each equal to one-half I, flow from the source $+V$ up through diode $D_1$ and down through diode $D_2$, and that a small voltage $E_1$ exists across each of the diodes. The voltage at the output terminal 26 is thus equal to $E_1$. The voltage across diode $D_1$ is also equal to $E_1$ and is of opposite polarity so that the voltage at point 10 is substantially zero. The inductor 12 and the resistor 24 cooperate to hold the voltage at point 10 near ground potential while permitting the input pulse 22 to be effective in supplying current to the diodes $D_1$ and $D_2$ for switching purposes.

Figure 2C:
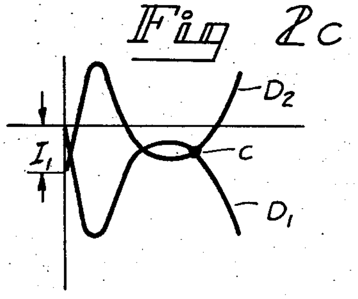
Figure 2B:
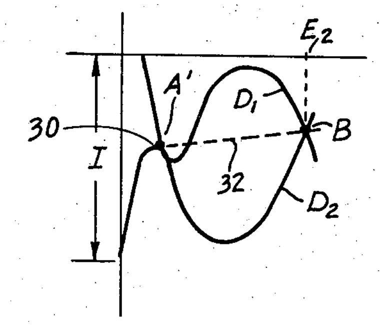

When a positive input pulse 22 is applied across the two series-connected diodes, the polarity of the input pulse is such as to move the diode $D_1$ load line to the right, as shown in FIGURE 2*b*. This causes the intersection of the two curves to move up and over the peak 30 of the curve $D_2$ to an operating point A′ where the negative resistance region is encountered, with the result that the operating point of the diode $D_2$ switches rapidly along a path such as the dashed line 32 toward the high voltage operating point B.

When diode $D_2$ is in the process of switching to its high voltage state, an increased voltage appears at the junction point 16 which is more positive than the initial voltage +V' applied to the point 16. This causes an increased current to flow up through the diode $D_1$, with the result that the diode $D_1$ also switches to its high voltage state. The switching of the two diodes to operating point B in their high voltage states occurs almost simultaneously.

The high voltage state of the diode $D_2$ results in an output voltage in the output terminal 26 having a value $E_2$. The voltage at the point 10 across both diodes is substantially zero because the diode $D_1$ is also in its high voltage state and also has across it a voltage $E_2$ in a polarity opposite that of the voltage $E_2$ across diode $D_2$. The voltage across the diode $D_1$ opposes the voltage across the diode $D_2$ so that substantially zero voltage exists at point 10. It is thus evident that when an output voltage 34 exists at the output terminal 26, this output voltage is not coupled back to the input terminal 18. Stated another way, the output terminal 26 is substantially isolated electrically from the input terminal 18.

After the diodes $D_1$ and $D_2$ have shifted to their high voltage states and are at operating point B, the energy stored in the inductor 14 is depleted by the gradually decreasing current I supplied to the junction point 16. The decreasing current I may be viewed as causing an upward shifting of the diode curve $D_2$. A point in the operation is reached, which is illustrated in FIGURE 2*c*, where the current has a value $I_1$ and the curve $D_2$ has shifted upwardly so that the intersection of the two curves is at C. In the interval, the operating point has moved to the left and up from the point B in FIGURE 2*b* to the operating point C in FIGURE 2*c*.

Figure 2D:
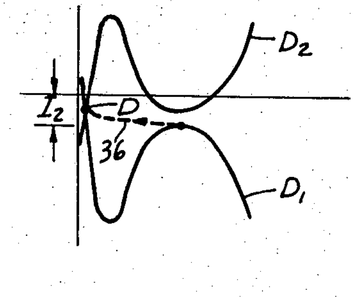

The current supplied by the inductor 14 decreases until a value $I_2$ is reached, as illustrated in FIGURE 2*d*, at which time the negative resistance region of diode $D_2$ is again encountered, and the operating point rapidly switches along a path such as the dotted path 36 to the operating point D. Thereafter, the current I through inductor 14 starts to build up as the result of current flowing from the source +V' until the quiescent condition, as illustrated in FIGURE 2*a*, is again established. The diodes $D_1$ and $D_2$ are then again in their low voltage states at an operating point A.

The duration of the output pulse 34 is determined by the time constant of the reactive and resistive circuit elements. It will be noted that throughout the cycle of operation, the voltage at the point 10 remains substantially zero. This is because the diodes $D_1$ and $D_2$ are always both in their low voltage states, or are both in their high voltage states. The diodes, being oppositely poled, have voltages across them which cancel at point 10 and at the input terminal 18. Therefore, the output terminal 26 is isolated electrically from the input terminal 18.

Figure 3:
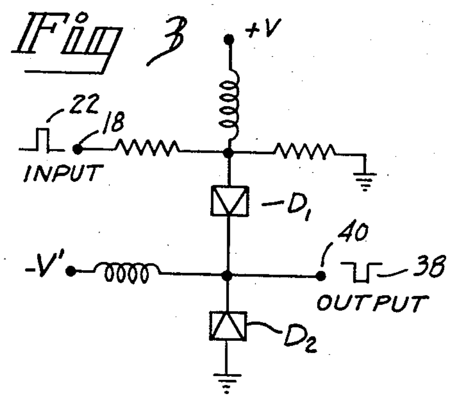
FIGURE 3 is a tunnel diode circuit differing from that of FIGURE 1 in providing inverter action whereby the output signal is of reversed polarity compared with the input signal.

FIGURE 3 shows a unidirectional pulse circuit which provides an output pulse having a polarity opposite to that of the input pulse. The circuit of FIGURE 3 therefore is an inverter. The inversion function is accomplished in a circuit differing from the circuit of FIGURE 1 in that the polarities of bias source terminals are reversed, and in that the poling of the diodes $D_1$ and $D_2$ is reversed. The operation of the circuit of FIGURE 3 is the same as has been described in connection with the circuit of FIGURE 1 except that the directions of current flow are reversed, and except that the positive input pulse 22 initially causes diode $D_1$ to switch to its high voltage state. During the switching of diode $D_1$, the diode $D_2$ is also caused to switch to its high voltage state. This causes a negative polarity output pulse 38 to be developed across the tunnel diode $D_2$. In other respects, the operation of the circuits of FIGURES 1 and 3 are similar. The negative output pulse 38 at terminal 40 is effectively decoupled from the input terminal 18.

Figure 4:
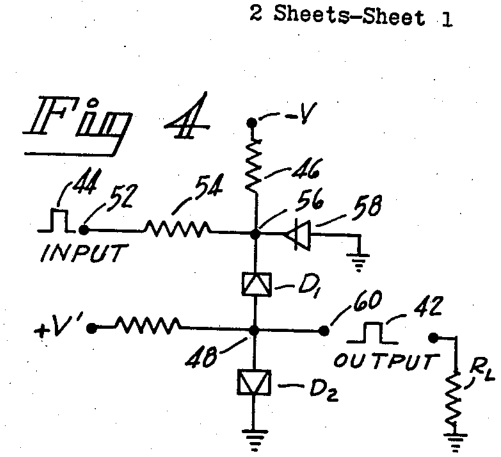
FIGURE 4 is a circuit diagram of a bistable circuit which has an output terminal that is electrically isolated from the input terminal, and which provides an output signal having a duration substantially coextensive in time with the input signal.

FIGURE 4 shows a directional tunnel diode circuit which provides a positive output pulse 42 having a duration substantially the same as the duration of input pulse 44. The circuit of FIGURE 4 differs from the circuit of FIGURE 1 in that it does not include the inductors which determine the duration of the output pulse in the circuit of FIGURE 1. The circuit of FIGURE 4 has oppositely poled serially-connected tunnel diodes $D_1$ and $D_2$ which are connected in series through a resistor 46 to the +V terminal of a source of unidirectional potential. The junction point 48 between the diodes is connected through a resistor 50 to the −V' terminal of a source of unidirectional potential. A positive input pulse 44 is applied from an input terminal 52 and through an input resistor 54 to a terminal 56 so that the input pulse is effectively applied across the series combination of diodes $D_1$ and $D_2$. A tunnel rectifier 58 is connected from the point 56 to a point of reference potential such as ground to provide a voltage clamp close to ground potential. A conventional diode may be used in known fashion to provide the voltage clamp.

Figure 6:
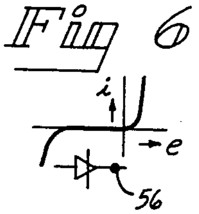
FIGURE 6 is a representation of the symbolic convention employed for the tunnel rectifiers included in the circuit of FIGURE 4.

The symbol employed to represent the tunnel rectifiers 58 and 60 is illustrated in FIGURE 6 in relation to the current-voltage characteristics of a tunnel rectifier. FIGURE 6 illustrates the convention wherein a small negative potential *e* applied at point 56 results in a large current flow in the direction of the arrow, and wherein a considerably larger positive voltage *e* applied at point 56 is required to cause a large current flow in the reverse direction.

In the operation of the circuit of FIGURE 4, a positive input pulse 44, of a somewhat larger amplitude than is used in the circuits of FIGURES 1 and 3, is applied across the diodes $D_1$ and $D_2$ to initially cause the diode $D_2$ to switch from its low voltage state to its high voltage state. Concurrently, with the switching of the diode $D_2$, the diode $D_1$ is caused to switch to its high voltage state. The high voltages across the diodes $D_1$ and $D_2$ are of opposite polarity, so that a substantially zero voltage appears between point 56 and ground. When both diodes are in their high voltage states, the high voltage across diode $D_2$ appears as a positive output pulse 42 at the output terminal 60 and diode $D_2$ delivers an output current to the load resistor $R_L$.

When the trailing edge of the input pulse 44 occurs, the input current is removed, and diode $D_2$ is switched to its low voltage state. This occurs because after the pulse 44 terminates there is not enough current available to supply the load $R_L$ and to maintain the diode $D_2$ in its high voltage state. The diode $D_2$ is thus forced into its low voltage state, and the junction point 48 assumes a low positive voltage near ground potential. Diode $D_1$ then is forced to its low voltage state, by reason of the low voltage difference across it between junction point 48 and the junction point 56, the point 56 being clamped near ground by the tunnel rectifier 58.

Figure 5:
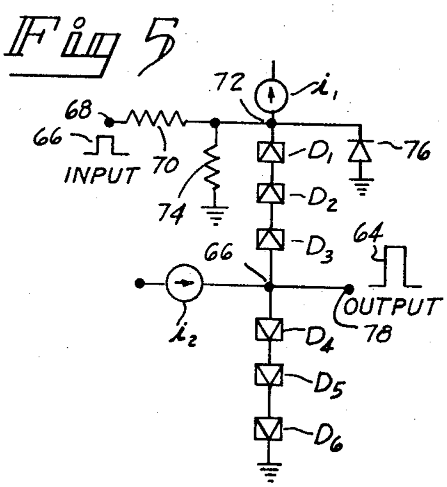
FIGURE 5 is a circuit diagram of an arrangement, according to the invention, for providing a relative high voltage output signal.

FIGURE 5 illustrates a unidirectional tunnel diode circuit which provides an output pulse 64 having a substantially higher voltage than the input pulse 66. The circuit of FIGURE 5 is similar to the circuits of FIGURES 1 and 4 but it differs in that it includes three similarly poled serially-connected tunnel diodes $D_1$, $D_2$ and $D_3$ in place of the diode $D_1$ of FIGURE 1; and it includes three similarly poled serially-connected tunnel diodes $D_4$, $D_5$ and $D_6$ in place of the tunnel diode $D_2$ of FIGURE 1. A current source $i_1$ is connected to serve the purpose of the voltage source −V and the inductor 12 in FIGURE 1, and a current source $i_2$ is connected to the junction 66 to serve the purpose of the voltage source +V' and the inductor 14 in FIGURE 1. An input terminal 68 is connected through a resistor 60 to the junction point 72. The point 72 is connected to ground through a resistor 74 and through a convention diode or tunnel rectifier 76.

The operation of the circuit of FIGURE 5 is similar to the operation of the circuits previously described. All the diodes $D_1$ through $D_6$ are initially in their low voltage states. An input pulse 66 applied across the serially connected diodes $D_1$ through $D_6$ causes diode $D_6$ to switch to its high voltage state. (It is assumed that the diode $D_6$ has a slightly smaller peak current than the peak currents of diodes $D_4$ and $D_5$.) The switching of the diode $D_6$ causes a switching of, say, diode $D_3$ to its high voltage state. Then diodes $D_5$ and $D_2$ switch to their high voltage states; and then diodes $D_4$ and $D_1$ switch to their high voltage states. Therefore, the result of the application of the input pulse 66 is to cause all of the diodes $D_1$ through $D_6$ to very rapidly switch to their high voltage states. When this occurs, an output pulse 64 appears at the output terminal 78 across the diodes $D_4$, $D_5$ and $D_6$. Substantially zero voltage remains at point 72 across all the diodes because of the voltage cancelling effect of the diodes $D_1$, $D_2$ and $D_3$.

The characteristics of the current sources $i_1$ and $i_2$ determine whether diodes remain in their high voltage states for the duration of the input pulse or for a longer time determined by the time constants of the circuit. The mode of operation may be a monostable mode after the manner of the circuit of FIGURE 1, or may be a self-resetting bistable mode after the manner of operation of the circuit of FIGURE 4. The output voltage pulse 64 is considerably greater than the voltage of the input pulse 66.

It is therefore apparent that the circuit of FIGURE 5, like the circuits of FIGURES 1, 3 and 4, is characterized in having an output terminal that is substantially isolated from its input terminal.

What is claimed is:

1. A tunnel diode circuit comprising two oppositely poled tunnel diodes connected in series, means to bias said diodes for operation in the same one of their two operating voltage states, means to apply an input signal across the series combination of said diodes, whereby said diodes are switched, and means to derive an output signal from the junction between said diodes.

2. A tunnel diode circuit comprising two oppositely poled tunnel diodes connected in series, means to bias said diodes for operation in the same one of their two operating voltage states, means to apply an input pulse across the series combination of said diodes, whereby said diodes are switched to their same other voltage states, and means to derive an output signal from across one of the diodes.

3. A tunnel diode circuit comprising a group of similarly poled tunnel diodes connected in series with a group of oppositely poled tunnel diodes, means to bias all of said diodes for operation in the same one of their two operating voltage states, means to apply an input signal across the series combination of all of said diodes, whereby said diodes are switched, and means to derive an output signal from the junction between said groups of diodes.

4. A circuit comprising two oppositely poled negative resistance diodes connected in series, means to bias said diodes for operation in the same one of two operating voltage states, means to apply an input signal across the series combination of said diodes, whereby said diodes are switched, and means to derive an output signal from across one of the diodes.

5. A directional negative resistance diode circuit comprising first and second oppositely poled diodes connected in series, means to connect a bias source to the junction between said diodes, means to connect a bias source to the other end of said first diode, means to apply an input signal across the series combination of said diodes, and means to derive an output signal from across one of said diodes.

6. A directional tunnel diode circuit comprising first and second oppositely poled tunnel diodes connected in series, means to connect one bias source to supply a bias current to the junction between said diodes, means to connect another bias source to the other end of said first diode to supply a bias current serially through both diodes, means to apply an input signal across the series combination of said diodes, and means to derive an output signal from across one of said diodes.

7. A directional tunnel diode circuit comprising first and second oppositely poled tunnel diodes connected in series, means to connect one bias source to supply a bias current to the junction between said diodes, means to connect another bias source to the other end of said first diode to supply a bias current serially through both diodes, means to apply an input pulse across the series combination of said diodes, and means to derive an output pulse from across one of said diodes.

8. A directional tunnel diode circuit comprising first and second oppositely poled tunnel diodes connected in series, means including an inductor to connect a bias source to the junction between said diodes, means including an inductor to connect a bias source to the other end of said first diode, said diodes being both quiescently biased in the same one of their two voltage states, means to apply an input pulse across both of said diodes, whereby said diodes switch to their other voltage states, and means to derive an output signal from across one of said diodes.

9. A directional tunnel diode circuit comprising two oppositely poled tunnel diodes connected in series, means to quiescently bias said diodes for operation in the same one of two voltage states, whereby the voltage across both diodes is substantially zero due to cancellation of equal and opposite voltages, means to apply an input pulse across said series-connected diodes to cause one of the diodes to change its voltage state and consequently cause the other diode to change its voltage state, whereby the voltage across both of said diodes is again substantially zero due to cancellation of equal and opposite voltages, and means to derive an output pulse from across one of said diodes.

10. A directional tunnel diode circuit comprising two oppositely poled tunnel diodes connected in series, means to quiescently bias both of said diodes for operation in their low voltage states, means to apply an input pulse across both of said series-connected diodes to cause one of the diodes to switch to its high voltage state and consequently cause the other diode to switch to its high voltage state, whereby the voltage across said diodes is substantially zero due to cancellation of equal and opposite voltages, and means to derive an output pulse from across one of said diodes.

11. A directional tunnel diode circuit comprising two oppositely poled tunnel diodes connected in series, means to quiescently bias said diodes in the same one of two voltage states for monostable operation, means to apply an input pulse across said series-connected diodes to cause them to switch to the other one of their voltage states for a given period of time and then return to their original voltage states, whereby the voltage across said diodes is always substantially zero due to cancellation of equal and opposite voltages, and means to derive an output pulse from across one of said diodes.

12. A directional tunnel diode circuit comprising two oppositely poled tunnel diodes connected in series, means to quiescently bias said diodes for operation in their low voltage states, said means including a voltage source and an inductor connected across the series-connected diodes, and a second voltage source and a second inductor connected across one of said diodes, means to apply an input pulse across said series-connected diodes to cause said diodes to switch to their high voltage states, whereby the voltage across said diodes is always substantially zero due to cancellation of equal and opposite voltages, and means to derive an output pulse from across one of said diodes.

13. An inverter circuit comprising two oppositely-poled tunnel diodes connected in series, means to apply an input pulse across both of said diodes in a polarity to make one of said diodes switch, whereby said other diode also is caused to switch, and means to derive an opposite polarity pulse from across said other diode.

14. An inverter circuit comprising two oppositely-poled tunnel diodes connected in series, means to bias said diodes for operation in one of their two operating voltage states, means to apply an input pulse across both of said diodes in a polarity to make one of said diodes switch, whereby said other diode also is caused to switch, and means to derive an opposite polarity pulse from across said other diode.

15. An inverter circuit comprising two oppositely-poled tunnel diodes connected in series, a first bias means connected across both of said diodes in series, a second bias means connected to the junction between said diode, means to apply an input pulse across both of said diodes in a polarity to make one of said diodes switch, whereby said other diode also is caused to switch, and means to derive an opposite polarity pulse from across said other diode.

References Cited in the file of this patent

UNITED STATES PATENTS

| | | |
|---|---|---|
| 1,883,613 | Devol | Oct. 18, 1932 |
| 2,614,140 | Kreer | Oct. 14, 1952 |
| 2,966,599 | Haas | Dec. 27, 1960 |

OTHER REFERENCES

International Solid-State Circuits Conference Digest of Technical Papers, "Esaki (Tunnel). Diode Logic Circuits," Neff et al., Feb. 10, 1960, pp. 16, 17. "The Tunnel Diode as a Storage Element," Miller et al., pp. 52, 53, Feb. 11, 1960.

Notice of Adverse Decision in Interference

In Interference No. 95,800 involving Patent No. 3,142,768, M. M. Kaufman, UNIDIRECTIONAL TUNNEL DIODE PULSE CIRCUITS, final judgment adverse to the patentee was rendered Feb. 10, 1969, as to claims 1, 2, 4 to 7, 9 to 11 and 13 to 15.

[*Official Gazette August 5, 1969.*]

Disclaimer 3,142,768.—*Melvin M. Kaufman*, Merchantville, N.J. UNIDIRECTIONAL TUNNEL DIODE PULSE CIRCUITS. Patent dated June 28, 1964. Disclaimer filed Feb. 25, 1969, by the assignee, *Radio Corporation of America.*

Hereby enters this disclaimer to claims 1, 2, 4, 5, 6, 7, 9, 10, 11, 13, 14 and 15 of said patent.

[*Official Gazette September 23, 1969.*]